United States Patent
Hatsuda (10) Patent No.: US 8,520,465 B2
(45) Date of Patent: Aug. 27, 2013

(54) SEMICONDUCTOR DEVICE

(75) Inventor: Kosuke Hatsuda, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 78 days.

(21) Appl. No.: 13/235,426

(22) Filed: Sep. 18, 2011

(65) Prior Publication Data

US 2012/0069668 A1    Mar. 22, 2012

(30) Foreign Application Priority Data

Sep. 22, 2010    (JP) .................. 2010-212628

(51) Int. Cl.
*G11C 8/00*    (2006.01)
(52) U.S. Cl.
USPC ........................................... 365/233.1
(58) Field of Classification Search
USPC ......................... 365/233.1; 363/60
See application file for complete search history.

(56) References Cited

U.S. PATENT DOCUMENTS

| | | | |
|---|---|---|---|
| 6,236,581 B1 * | 5/2001 | Foss et al. .................... | 363/60 |
| 7,679,429 B2 | 3/2010 | Nakamura | |
| 7,911,871 B2 | 3/2011 | Hidaka | |

FOREIGN PATENT DOCUMENTS

| | | |
|---|---|---|
| JP | 2007-109008 | 4/2007 |
| JP | 2008-253031 | 10/2008 |

\* cited by examiner

*Primary Examiner* — Anthan Tran
(74) *Attorney, Agent, or Firm* — Oblon, Spivak, McClelland, Maier & Neustadt, L.L.P.

(57) ABSTRACT

According to one embodiment, a semiconductor storage device includes a transistor, a first node, a first capacitor, a first switch, and a second switch. One end of the transistor is connected to a first voltage source supplying a first voltage. The first node is charged to the first voltage by the transistor. One of electrodes of the first capacitor is connected to the first node, and the other of the electrodes of the first capacitor is supplied with a first clock signal having a second voltage. One end of the first switch is connected to the first node. The first switch outputs a potential of the first node at a first time at which the first switch is turned on. One end of the second switch is connected to the first node. The second switch outputs the potential of the first node at a second time.

17 Claims, 8 Drawing Sheets

SEMICONDUCTOR DEVICE

CROSS-REFERENCE TO RELATED APPLICATIONS

This application is based upon and claims the benefit of priority from prior Japanese Patent Application No. 2010-212628, filed Sep. 22, 2010, the entire contents of which are incorporated herein by reference.

FIELD

Embodiments described herein relate generally to a semiconductor device having a voltage generation circuit whose size of area may be reduced.

BACKGROUND

Today, semiconductor memories are widely used in main storage devices of large-scale computers, personal computers, home electric appliances, cellular phones, and the like. A NAND flash memory is a typical example of flash EEPROM non-volatile memories.

Examples of NAND flash memories include various kinds of memory cards such as an SD™ Card, an MMC card, an MS card, and a CF card, which are used as media for storing information about images, video, audio, games, and the like. In addition, NAND flash memories are also used as storage media for digital cameras, digital video camcorders, music devices such as MP3, and mobile personal computers, and are also used as storage media for digital television sets. Today, the production of these NAND flash memories increases in the market.

Flash EEPROM-type nonvolatile memories mainly include the NOR type and NAND type. In the NOR type, data are readable at a high rate and the number of reads is approximately $10^{13}$. The NOR type is used as an instruction code storage of a portable device. On the other hand, the NOR type has a small effective bandwidth at the time of writing data and is not suitable for file record or the like.

Compared with the NOR type, the NAND type may be integrated with a high-density. Although the access time of the NAND type is slower than the NOR type by 25 µs, the NAND type is capable of burst read and has a wide effective bandwidth.

Therefore, the data write time is 200 µs, and the data erase time is about 1 ms, which is slower than the NOR type. However, the NAND type may write and erase a larger number of bits of data at a time. Therefore, with the NAND type, data are fetched in a burst mode and data may be written in units of pages. That is, the NAND type is a memory with a high effective bandwidth and is used as a memory card and a USB memory, and is recently used as a memory of a mobile phone.

In a NAND-type flash memory, a high voltage of about 20V is used to write and erase data. Therefore, a high voltage is generated by a voltage generation circuit using a multi-stage charge circuit. However, the multi-stage charge circuit is a large-scale circuit, which occupies a large area. If an area of one charge circuit may be reduced, the overall size of area of the charge circuit may be reduced.

DETAILED DESCRIPTION

Hereinafter, embodiments will be described with reference to the drawings. In this description, the same reference numerals are given to the same portions throughout the drawings.

First Embodiment

In general, according to one embodiment, a semiconductor storage device includes a first transistor, a first node, a first capacitor, a first switch element, and a second switch element. One end of the first transistor is connected to a first voltage source supplying a first voltage. The first node is charged to the first voltage by the first transistor. One of electrodes of the first capacitor is connected to the first node. The other of the electrodes of the first capacitor is supplied with a first clock signal having a second voltage. One end of the first switch element is connected to the first node. The first switch element outputs a potential of the first node at a first time at which the first switch element is turned on. One end of second switch element is connected to the first node. The second switch element outputs the potential of the first node at a second time, which is different from the first time, at which the second switch element is turned on.

Figure 1:
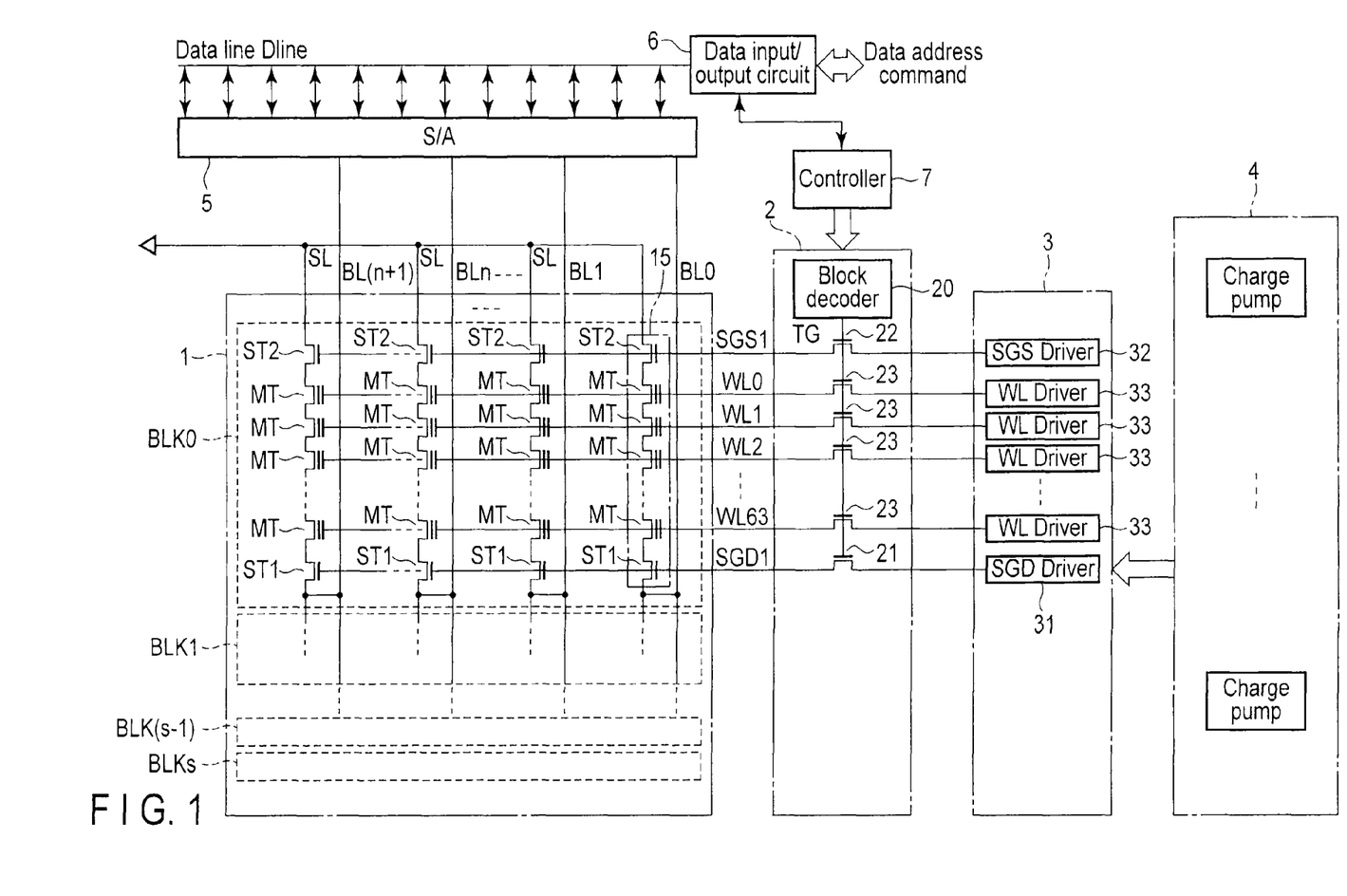
FIG. 1 is an overall view of a NAND flash memory according to the first embodiment.

FIG. 1 is an overall view of a NAND flash memory according to the present embodiment.

<1. Example of Entire Configuration>

As shown in FIG. 1, the NAND-type flash memory comprises a memory cell array 1, a row decoder 2, a driver circuit 3, a voltage generating circuit 4, a sense amplifier 5, a data input/output terminal 6, and a controller 7.

<Memory Cell Array 1>

The memory cell array 1 includes blocks BLK0 to BLKs (s is a natural number) including multiple nonvolatile memory cell transistors MT. Each of the blocks BLK0 to BLKs includes multiple NAND strings 15, and the nonvolatile memory cell transistors MT are connected in series in each of the NAND strings 15. Each of the NAND strings 15 includes 64 memory cell transistors MT and selection transistors ST1 and ST2.

The memory cell transistor MT may retain data having two or more values. The structure of the memory cell transistor MT is an FG type. In the FG type, the memory cell transistor MT includes a floating gate (conductive layer) formed on a P-type semiconductor substrate with a gate insulator film interposed therebetween and a control gate formed on the floating gate with a gate insulator film interposed therebetween. The memory cell transistor MT may be a MONOS type. In the MONOS type, the memory cell transistor MT includes a charge accumulation layer (for example, an insulator film), an insulator film (hereinafter referred to as a block layer), and a control gate electrode. The charge accumulation layer is formed on a semiconductor substrate with a gate insulator film interposed therebetween. The block layer is formed on the charge accumulation layer, and the block layer has a dielectric constant higher than that of the charge accumulation layer. The control gate electrode is formed on the block layer.

The control gate of the memory cell transistor MT acts as a word line, a drain is electrically connected to a bit line, and a source is electrically connected to a source line. The memory cell transistor MT is an N-channel MOS transistor. The number of memory cell transistors MT is not limited to 64. It may be 128, 256, or 512. The number of memory cell transistors MT is not particularly limited.

The source and the drain are shared by the memory cell transistors MT adjacent to each other. A current pathway of the memory cell transistors MT is disposed between the selection transistors ST1 and ST2 so as to be connected in series. A drain region on one end of the series-connected memory cell transistors MT is connected to a source region of the selection transistor ST1, and a source region on the other end side is connected to a drain region of the selection transistor ST2.

Control gate electrodes of the memory cell transistors MT located in the same row are commonly connected to one of word lines WL0 to WL63, and gate electrodes of the selection transistors ST1 and ST2 located in the same row are respectively connected to select gate lines SGD1 and SGS1. For the sake of simplicity of explanation, when each of the word lines WL0 to WL63 is not distinguished, they may be simply referred to as word lines WL. In the memory cell array 1, each of the drains of the selection transistors ST1 in the same column are commonly connected to any one of the bit lines BL0 to BLn. In the explanation below, when each of the bit lines BL0 to BLn (n: natural number) is not distinguished, they may be collectively referred to as bit lines BL. The sources of the selection transistors ST2 are commonly connected to the source line SL.

Data are collectively written in the plural memory cell transistors MT connected to the same word line WL, and the unit in which the data are collectively written in the memory cell transistors MT is referred to as a page. In the plural memory cell transistor MT, data are collectively erased in units of blocks BLK.

<Row Decoder 2>

Subsequently, the row decoder 2 will be described. The row decoder 2 includes a block decoder 20 and N-channel MOS transistors 21 to 23. During the data write operation, the data read operation, and the data erase operation, the block decoder 20 decodes a block address supplied from the controller 7, and the block decoder 20 selects the block BLK based on the decode result. That is, the block decoder 20 selects a control line TG connected to MOS transistors 21 to 23 corresponding to the block BLK including the selected memory cell transistor MT, and the block decoder 20 turns on the MOS transistors 21 to 23. At this point, the block decoder 20 supplies a block selection signal. The block selection signal means a signal based on which the row decoder selects one of the multiple memory blocks BLK0 to BLKs during the data read operation, the data write operation, and the data erase operation. Further, the row decoder 2 selects the row direction of the memory cell array 1 corresponding to the selected block BLK. That is, the row decoder 2 applies a voltage, supplied from the driver circuit 3, to the select gate lines SGD1 and SGS1 and word lines WL0 to WL63 based on the block selection signal supplied from the block decoder 20.

<Driver Circuit 3>

Subsequently, the driver circuit 3 will be described. The driver circuit 3 includes select gate line drivers 31 and 32 and word line drivers 33. The select gate line drivers 31 and 32 are provided in the select gate lines SGD1 and SGS1, respectively. Each of the word line drivers 33 is provided in each of the word lines WL. In the present embodiment, only the word line drivers 33 and select gate line drivers 31 and 32 corresponding to the block BLK0 are illustrated. However, in reality, the word line drivers 33 and the select gate line drivers 31 and 32 are commonly connected to the 64 word lines WL and the select gate lines SGD1 and SGS1, and the 64 word lines WL and the select gate lines SGD1 and SGS1 are provided in each of the blocks BLK0 to BLKs.

A block BLK is selected on the basis of a decoded result of a page address given by the controller 7. The word line driver 33 transfers the necessary voltage supplied from the driver circuit 3 to the control gate of the memory cell transistor MT provided in the selected block BLK through the selected word line WL. The select gate line driver 31 transfers the necessary voltage to the gate of the selection transistor ST1 through the select gate line SGD1 corresponding to the selected block BLK. At this point, a signal sgd is transferred to the gate of the selection transistor ST1 by the select gate line driver 31. More specifically, in writing, reading, erasing, and verifying the data, the select gate line driver 31 transfers, for example, the signal sgd to the gate of the selection transistor ST1 through the select gate line SGD1. As the signal sgd, an "L" level is set to 0 V and an "H" level is set to a voltage VDD (for example, 1.8 V).

As with the select gate line driver 31, the select gate line driver 32 transfers the necessary voltage to the gate of the selection transistor ST2 through the select gate line SGS1 in writing, reading, erasing, and verifying the data via the select gate line SGS1 corresponding to the selected block BLK. At this occasion, the select gate line driver 32 transfers the signal sgs to the gate of the selection transistor ST2. As a signal sgs, the "L" level is set to 0 V, and the "H" level is set to the voltage VDD.

<High Voltage Generation Circuit 4>

Figure 2:
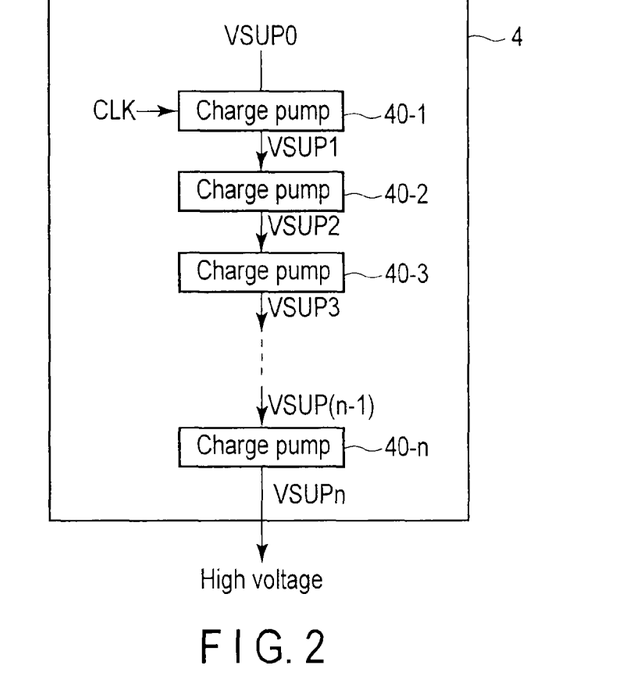
FIG. 2 is a schematic diagram illustrating a high voltage generation circuit according to the first embodiment.

Subsequently, the high voltage generating circuit 4 will be described with reference to FIG. 2. As shown in FIG. 2, the high voltage generation circuit 4 includes charge pumps 40-1, 40-2, 40-3, . . . , 40-$n$ (n: natural number). In the explanation below, when each of the charge pumps 40-1, 40-2, 40-3, . . . , 40-$n$ is not distinguished, they are simply referred to as charge pumps 40. Among the multiple charge pumps 40, the charge pump 40-1 in the first stage receives an internal voltage VSUP0 as an input voltage, and outputs a voltage VSUP1 to the charge pump 40-2 in the subsequent stage. The charge pump 40-2 receives the voltage VSUP1 provided by the charge pump 40-1 as an input voltage, and outputs a voltage VSUP2 to the charge pump 40-3 in the subsequent stage. Likewise, the charge pump 40-$n$ receives a voltage VSUP(n−1) as an input voltage, and outputs a voltage VSUPn.

When each charge pump 40 receives the clock CLK, the charge pump 40 outputs the voltage VSUP. It should be noted that the size of VSUP given to the charge pump 40-1 in the first stage is a value such as 1.8[V] or 3.6[V].

<Sense Amplifier 5>

In reading the data, the sense amplifier 5 senses and amplifies the data read from the memory cell transistor MT to the bit line BL. The sense amplifier 5 transfers write data to the corresponding bit line BL in writing the data.

<Data Input/Output Terminal 6>

Subsequently, the data input/output circuit 6 will be described. The data input/output circuit 6 outputs an address and a command provided by a host via an I/O terminal, not shown, to the controller 7. The data input/output circuit 6 outputs write data to the sense amplifier 5 via a data line $D_{line}$. When data are output to the host, the data input/output circuit 6 receives the data amplified by the sense amplifier 5 via a data line $D_{line}$ and thereafter outputs the data to the host via the I/O terminal on the basis of the controller 7.

<Controller 7>

Subsequently, the controller 7 will be described. The controller 7 controls overall operation of the NAND-type flash memory. More specifically, the controller 7 executes an operation sequence of the data write operation, read operation and erase operation based on the address and command supplied from a host (not shown) via the data input/output circuit 6. The controller 7 generates a block select signal/column select signal based on the address and operation sequence.

The controller 7 outputs the block select signal to the row decoder 3. In addition, the controller 7 outputs a column select signal to the sense amplifier 5. The column select signal is a signal for selecting a column direction of the sense amplifier 5.

The controller 7 receives a control signal from the host, not shown. The controller 7 determines whether a signal supplied to the data input/output circuit 6 from the host through the I/O terminal, not shown, is an address or data by using the supplied control signal.

The controller 7 controls a timing of a clock signal transferred to a clock generation circuit 50 (explained later). This clock signal may be transferred from the host, or may be generated by the controller 7 itself.

<2. Details of High Voltage Generation Circuit 4 (Configuration of Charge Pump)>

Subsequently, an example of the internal configuration of the charge pump 40 in the high voltage generation circuit 4 explained above will be explained with reference to FIG. 3.

Figure 3:
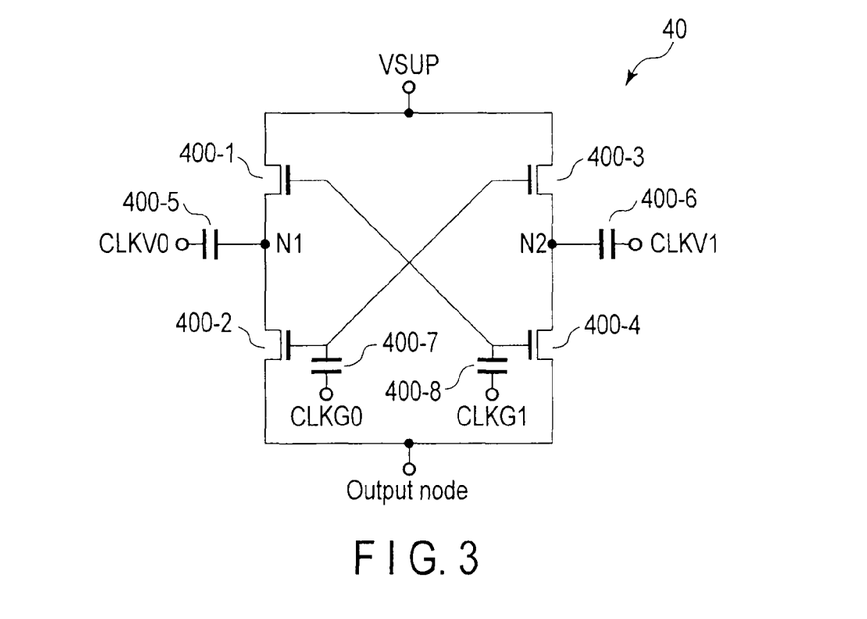
FIG. 3 is a schematic diagram illustrating a charge pump according to the first embodiment.

As shown in the figure, the charge pump 40 has N-channel MOS transistors 400-1 to 400-4 and capacitor elements 400-5 to 400-8.

The voltage VSUP (internal voltage (for example, 1.8 V) or external voltage) is supplied to one end of a current pathway of the MOS transistor 400-1, and the other end thereof is connected to a node N1. When the MOS transistor 400-1 is in the ON state, the MOS transistor 400-1 transfers the voltage VSUP to the node N1.

One end of a current pathway of the MOS transistor 400-2 is connected to the node N1, and the other end thereof is connected to an output node. One of electrodes constituting the capacitor element 400-5 is connected to the node N1, and the other of the electrodes thereof receives a clock signal (hereinafter referred to as a clock CLKV0). When the voltage of the node N1 is charged to the voltage VSUP by the MOS transistor 400-1, and a square wave (for example, voltage VSUP) having a certain level of voltage is thereafter input to the capacitor element 400-5 as, e.g., a clock CLKV0, the voltage of the node N1 attains the voltage VSUP×2. At this occasion, when a voltage (VSUP+Vth1) is applied to the gate of the MOS transistor 400-1, the potential of the node N1 attains the voltage VSUP. It should be noted that the voltage Vth1 is a threshold voltage of the MOS transistor 400-1. When the MOS transistor 400-2 is in the ON state, the voltage VSUP×2 at the node N1 is transferred to the output node. In this example, the voltage input to the capacitor element 400-5 is the voltage VSUP. However, the voltage is not limited thereto. In other words, it may be a value less than the voltage VSUP, or naturally, it may be a value larger than the voltage VSUP.

Therefore, the voltage output to the output node is changed according to the voltage input to the capacitor element 400-5. In the embodiments described below, for example, the square wave input to the capacitor element 400-5 is assumed to be the voltage VSUP.

One end of a current pathway of the MOS transistor 400-3 is commonly connected to one end of a current pathway of the MOS transistor 400-1. In other words, the voltage VSUP is supplied to the one end of the current pathway of the MOS transistor 400-3, and the other end of the current pathway of the MOS transistor 400-3 is connected to a node N2. The gate of the MOS transistor 400-3 is commonly connected to the gate of the MOS transistor 400-2. Like the MOS transistor 400-1, when the MOS transistor 400-3 is in the ON state, the MOS transistor 400-3 transfers the voltage VSUP to the node N2.

One end of a current pathway of the MOS transistor 400-4 is connected to the node N2, and the other end thereof is commonly connected to the other end of the current pathway of the MOS transistor 400-2 and the output node. The gate of the MOS transistor 400-4 is commonly connected to the gate of the MOS transistor 400-1. One end of electrodes constituting the capacitor element 400-6 is connected to the node N2, and a clock CLKV1 is input to the other of the electrodes thereof. When the voltage of the node N2 is charged to the voltage VSUP by the MOS transistor 400-3, and a square wave is thereafter input to the capacitor element 400-6 as, e.g., a clock CLKV1 (for example, voltage VSUP), the voltage of the node N2 attains the voltage VSUP×2. When the MOS transistor 400-4 is in the ON state, the voltage VSUP×2 at the node N2 is transferred to the output node. At this occasion, when a voltage (VSUP+Vth3) is applied to the gate of the MOS transistor 400-3, the potential of the node N1 attains the voltage VSUP. It should be noted that the voltage Vth3 is a threshold voltage of the MOS transistor 400-3. When the MOS transistor 400-4 is in the ON state, the voltage VSUP×2 at the node N2 is transferred to the output node.

Further, one of electrodes of the capacitor element 400-7 is commonly connected to the gates of the MOS transistors 400-2 and 400-3, and a clock CLKG0 is input to the other of the electrodes thereof. On the other hand, one of electrodes of the capacitor element 400-8 is commonly connected to the gates of the MOS transistors 400-1 and 400-4, and a clock CLKG1 is input to the other of the electrodes thereof. In other words, when the clock CLKG0 and the clock CLKG1 are input in a complementary manner, the MOS transistors 400-2, 400-3, 400-8, and 400-1 are repeatedly turned on and off in an alternating manner, and the voltage VSUP is alternately output to the output node.

<3. Input Clock Operation in Charge Pump 40>

Figure 4:
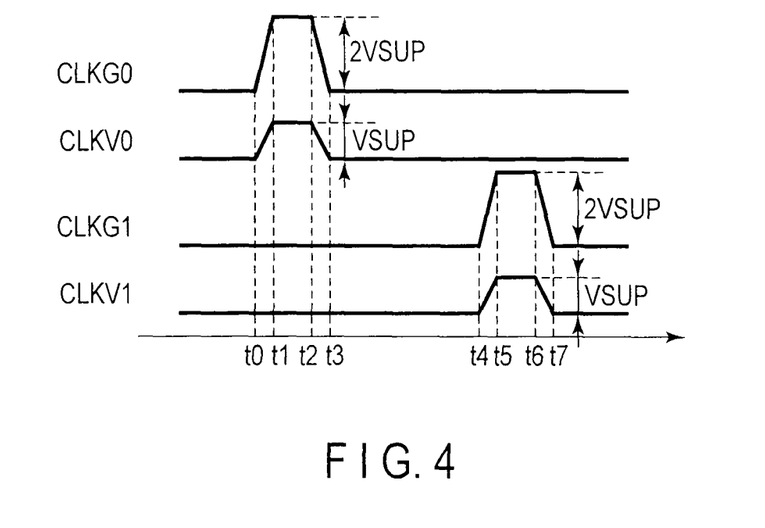
FIG. 4 is a time chart illustrating a clock provided to a charge pump according to the first embodiment.

Subsequently, a time chart illustrating a clock signal that is input to the charge pump will be explained with reference to FIG. 4. In the time chart, the horizontal axis represents a time, and the vertical axis represents the clocks CLKV1, CLKG1, CLKV0, and CLKG0.

First, the potential of the node N1 is assumed to be the voltage VSUP before time t0. In other words, the node N1 is charged to the voltage VSUP by the MOS transistor 400-1 with the clock CLKG1, not shown. Subsequently, at time t1, the clock CLKV0 having attained the voltage VSUP is input to the capacitor element 400-5. Then, the potential of the node N1 attains the voltage VSUP×2 via the capacitor element 400-5. At this occasion, since the clock CLKG1 is at the "L" level, the MOS transistor 400-1 is in the OFF state.

At the same time, i.e., time t1, the clock CLKG0 having attained the voltage VSUP×2 is applied to the capacitor element 400-7. As a result, the voltage VSUP×2 is respectively applied to the gates of the MOS transistor 400-3 and the MOS transistor 400-2, whereby both of the MOS transistors 400-2 and 400-3 are in the ON state. Therefore, the MOS transistor 400-2 transfers the voltage of the node N1 (VSUP×2−Vth2) to the output node, and the MOS transistor 400-3 transfers the voltage VSUP to the node N2. In this case, the voltage Vth2 is a threshold voltage of the MOS transistor 400-2. Thereafter, at time t3, each of the clock CLKG0 and the clock CLKV0 is at the "L" level.

Subsequently, at time t5, the clock CLKV1 having attained the voltage VSUP is supplied to the capacitor element 400-6. Then, the potential of the node N2 changes from the voltage VSUP to the voltage VSUP×2 via the capacitor element 400-6. At this occasion, since the clock CLKG0 is at the "L" level, the MOS transistor 400-3 is in the OFF state, and the potential of the node N2 does not flow backward to the source of the voltage via the MOS transistor 400-3.

At time t5, the clock CLKG1 having attained the voltage VSUP×2 is supplied to the capacitor element 400-8. As a result, the voltage VSUP×2 is applied to each of the gates of the MOS transistors 400-4 and 400-1. Therefore, the MOS transistors 400-1, 400-3 are in the ON state, and the voltage (VSUP×2−Vth4) is transferred from the node N2 to the output node. In this case, the voltage Vth4 is a threshold voltage of the MOS transistor 400-4. Thereafter, at time t7, each of the clock CLKG1 and the clock CLKV1 is at the "L" level, and the MOS transistors 400-4 are in the OFF state. The above-described operation is repeated in times subsequent thereto.

<4. Example of Configuration of Clock Generation Circuit 50>

Subsequently, an example of a configuration of the clock generation circuit 50 generating the clock CLKG0 and the clock CLKG1 supplied to the charge pump 40 will be explained with reference to FIG. 5. The clock generation circuit 50 is provided in each of the charge pumps.

As shown in the figure, the clock generation circuit 50 includes N-channel MOS transistors 500-1 and 500-2, capacitor elements 500-3 and 500-4, and inverters 500-5 and 500-6.

The external voltage VSUP is supplied to one end of the MOS transistor 500-1, and the other end thereof is connected to the node N3. The gate of the MOS transistor 500-1 is connected to a node N4. One end of a current pathway of the MOS transistor 500-2 and the one end of the current pathway of the MOS transistor 500-1 are commonly connected, and the other end of the current pathway of the MOS transistor 500-2 is connected to a node N4. The gate of the MOS transistor 500-2 is connected to the node N3. The MOS transistors 500-1 and 500-2 are alternately turned on according to the voltages of the nodes N4, N3, and the voltage VSUP is transferred to the nodes N3, N4.

One of electrodes of capacitor element 500-3 is connected to the node N3, and the other of the electrodes thereof is connected to a clock CLKA. The clock CLKA is, for example, a signal of an amplitude VSUP. One of electrodes of capacitor elements 500-4 is connected to the node N4, and a clock /CLKA is supplied to the other of the electrodes thereof. The capacity of the capacitor element 500-4 is less than the capacity of the capacitor element 500-3 as explained later. Therefore, the element itself is smaller than the capacitor element 500-3. The node N3 is connected to one of power source nodes of each the inverters 500-5, 500-6, and the other of the power source nodes is grounded. Clock signals /CLK0, /CLK1 output from the controller 7 are respectively supplied to input ends of the inverters 500-5, 500-6. The inverters 500-5, 500-6 output clocks CLKG0, CLKG1 according to the clock signals /CLK0, /CLK1.

Figure 5:
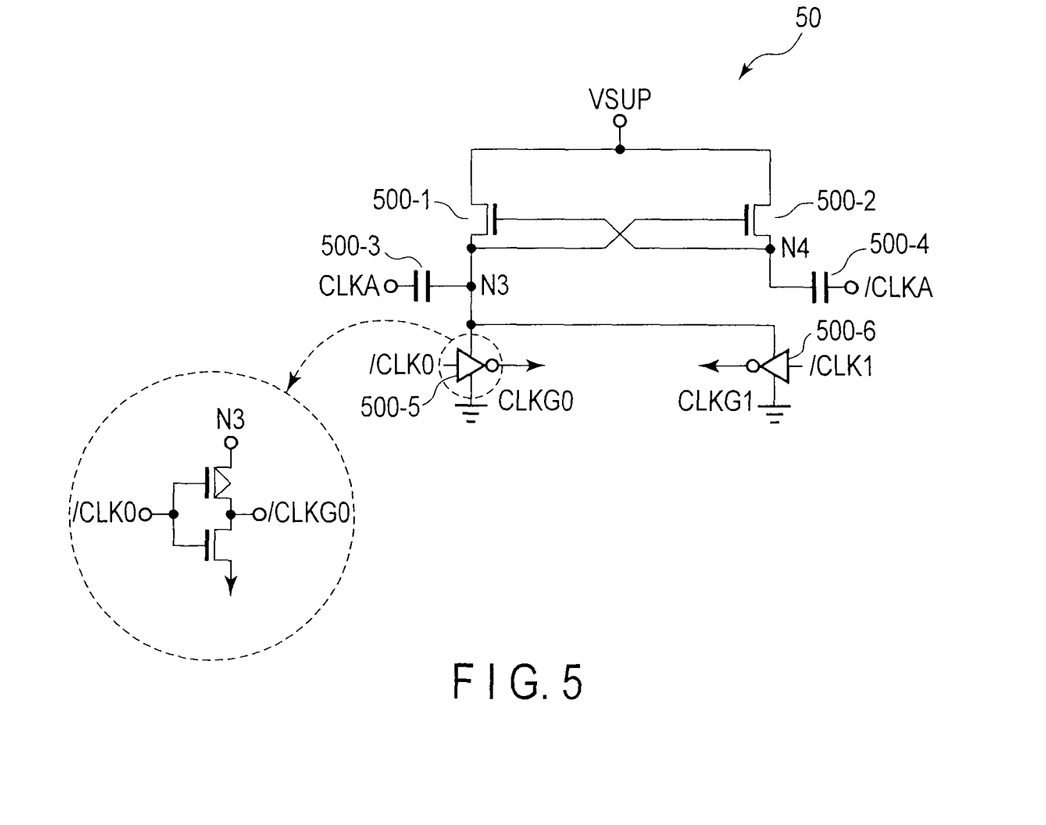
FIG. 5 is a schematic diagram illustrating a generation circuit generating a clock provided to the charge pump according to the first embodiment.

An example of the inverter 500-5 is shown at the lower left portion of FIG. 5. Each of the inverters 500-5, 500-6 has the same configuration. In this explanation, only the inverter 500-5 will be explained.

As shown in the figure, the inverter 500-5 includes a P-channel MOS transistor and an N-channel MOS transistor. One end of the current pathway of the P-channel MOS transistor (power source node) is connected to the node N3, and the other end thereof is connected to one end of the current pathway of the N-channel MOS transistor, and also serves as an output end of the clock CLKG0. The other end of the current pathway of the N-channel MOS transistor is grounded. The clock /CLK0 is given to the gates of the P-channel MOS transistor and the N-channel MOS transistor.

One end of the current pathway of the P-channel MOS transistor constituting the inverter 500-6 is connected to the node N3, and the other end thereof serves as an output end for outputting the clock CLKG1. The clock /CLK1 is supplied to the gate of the P-channel MOS transistor. The clock /CLK0 and the clock /CLK1 are supplied to the input ends of the inverters 500-5, 500-6 in a complementary manner. Accordingly, the inverters 500-5 and 500-6 alternately output the clock CLKG0 and the clock CLKG1. More specifically, the inverters 500-5 and 500-6 output the clock CLKG0 and the clock CLKG1 with the timing as shown in the time chart of FIG. 4.

In FIG. 5 explained above, the inverters are used as an example of a configuration for outputting the clocks CLKG0 and CLKG1. However, the configuration is not limited thereto as long as the potential of the node N3 and the ground potential may be alternately output as the clocks CLKG0 and CLKG1. In other words, a first switch and a second switch may be provided, wherein the first switch may electrically, temporarily connect the node N3 and the output end of the clock CLKG0, and the second switch may electrically, temporarily connect the ground potential and the output end of the clock CLKG0, according to the control of the clock /CLK0. In the embodiments below, an inverter is exemplified for the sake of simplicity.

<5. Clock Generation Operation of Clock Generation Circuit 50>

Figure 6:
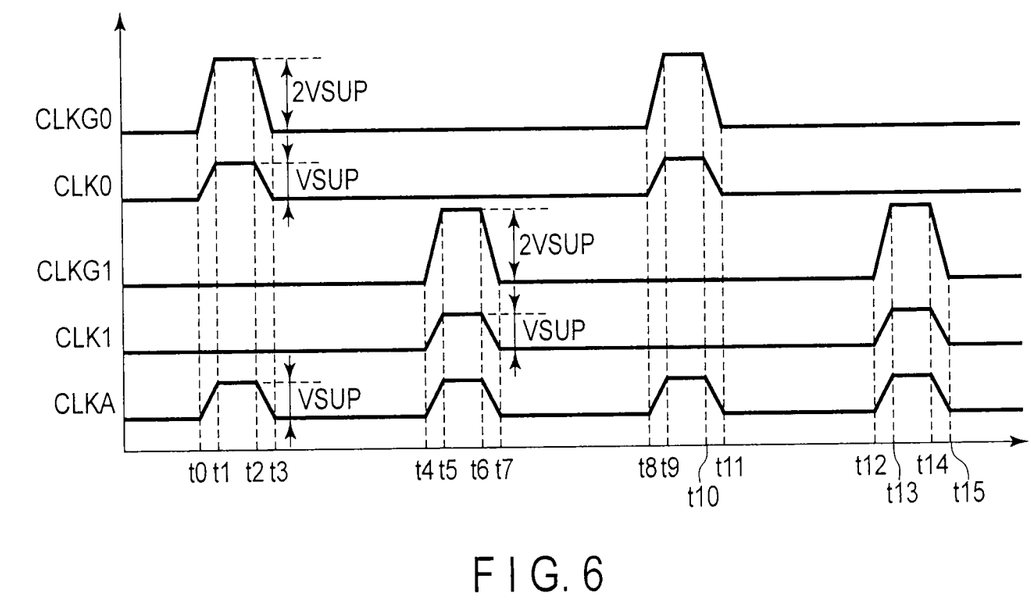
FIG. 6 is a time chart illustrating a clock provided to the generation circuit according to the first embodiment.

Subsequently, the operation in the above configuration will be explained with reference to FIG. 6. FIG. 6 is a time chart illustrating operation of generating the clocks CLKG0 and CLKG1 performed by the clock generation circuit 50. As shown in the figure, the horizontal axis represents a time, and the vertical axis represents the clock CLKG0, the clock CLK0, the clock CLKG1, the clock CLK1, and the clock CLKA. The clock CLKA is a signal obtained by NAND operation of the clock /CLK0 and the clock /CLK1; that is, when one of the clock /CLK0 and the clock /CLK1 is at the "L" level, and the clock CLKA is at the "H" level. First, the potential of the node N4 is set at the voltage VSUP. This means that the following case is assumed. The potential of the node N4 is charged to the voltage VSUP by the MOS transistor 500-2.

At a time before the time t0, a clock /CLKA (which is not shown in FIG. 6) is set at the "H" level (voltage VSUP). Therefore, the voltage VSUP is supplied to the capacitor element 500-4, and as a result, the potential of the node N4 is charged from the voltage VSUP to the voltage VSUP×2. Therefore, the MOS transistor 500-1 is in the ON state, and the potential of the node N3 attains the voltage VSUP. More specifically, in a period in which the clock /CLKA is at the "H" level (clock CLKA is at "L"), the potential of the node N3 is charged.

Subsequently, the clock CLKA attains the voltage VSUP at the time t1. When the voltage VSUP is supplied to the capacitor element 500-3, the potential of the node N3 increases from the voltage VSUP to the voltage VSUP×2. Since the potential of the node N3 attains the voltage VSUP, the MOS transistor 500-1 is in the OFF state. In other words, the potential of the node N3 does not flow backward toward the voltage source. When the potential of the node N3 is charged to the voltage VSUP×2, the MOS transistor 500-2 is in the ON state, and the potential of the node N4 is charged to the voltage VSUP.

At the same time, i.e., time t1, the clock CLK0 is at the "H" level (clock /CLK0="L"), and the P-channel MOS transistor constituting the inverter 500-5 is in the ON state. As a result, the potential at the node N3 VSUP×2 is output via the inverter 500-5 as the clock CLKG0 of the voltage VSUP×2.

Thereafter, at time t3, the clock CLK0 is at the "L" level, and the P-channel MOS transistor in the inverter 500-5 is in the OFF state. In other words, at the same time, i.e., time t3, the clock CLKG0 is also at the "L" level.

Since the clock CLKA is at the "L" level at time t3, the potential of the node N3 is charged to the voltage VSUP again. The maximum period in which it is charged is a period from times t3 to t4. That is, the higher the electric current supply rate of the MOS transistor 500-1 is, the shorter it takes for the node N3 to attain the voltage VSUP, and the time (t4–t3) is also reduced. For the sake of simplicity, it is assumed that the potential of the node N3 is charged to the voltage VSUP in a period between times t3 and t4 in the present embodiment.

Subsequently, at time t4, the clock CLKA attains the voltage VSUP. When the voltage VSUP is supplied to the capacitor element 500-3, the potential of the node N3 increases from the voltage VSUP to the voltage VSUP×2. Therefore, as described above, since the potential of the node N3 attains the voltage VSUP, the MOS transistor 500-1 is in the OFF state. In other words, the potential of the node N3 does not flow backward toward the voltage source.

At time t5, the clock CLK1 is at the "H" level (clock /CLK1="L"), and the P-channel MOS transistor constituting the inverter 500-6 is in the ON state. As a result, the potential at the node N3 VSUP×2 is output via the inverter 500-6 as the clock CLKG1 of the voltage VSUP×2.

Thereafter, at time t7, the clock CLK1 is at the "L" level, and the P-channel MOS transistor in the inverter 500-6 is in the OFF state. In other words, at the same time, i.e., time t7, the clock CLKG1 is also at the "L" level.

The same operation is repeated after time t8, so that the clock CLKG0 and the clock CLKG1 are alternately output from the inverters 500-5, 500-6.

<6. Layout of Clock Generation Circuit 50>

Figure 7:
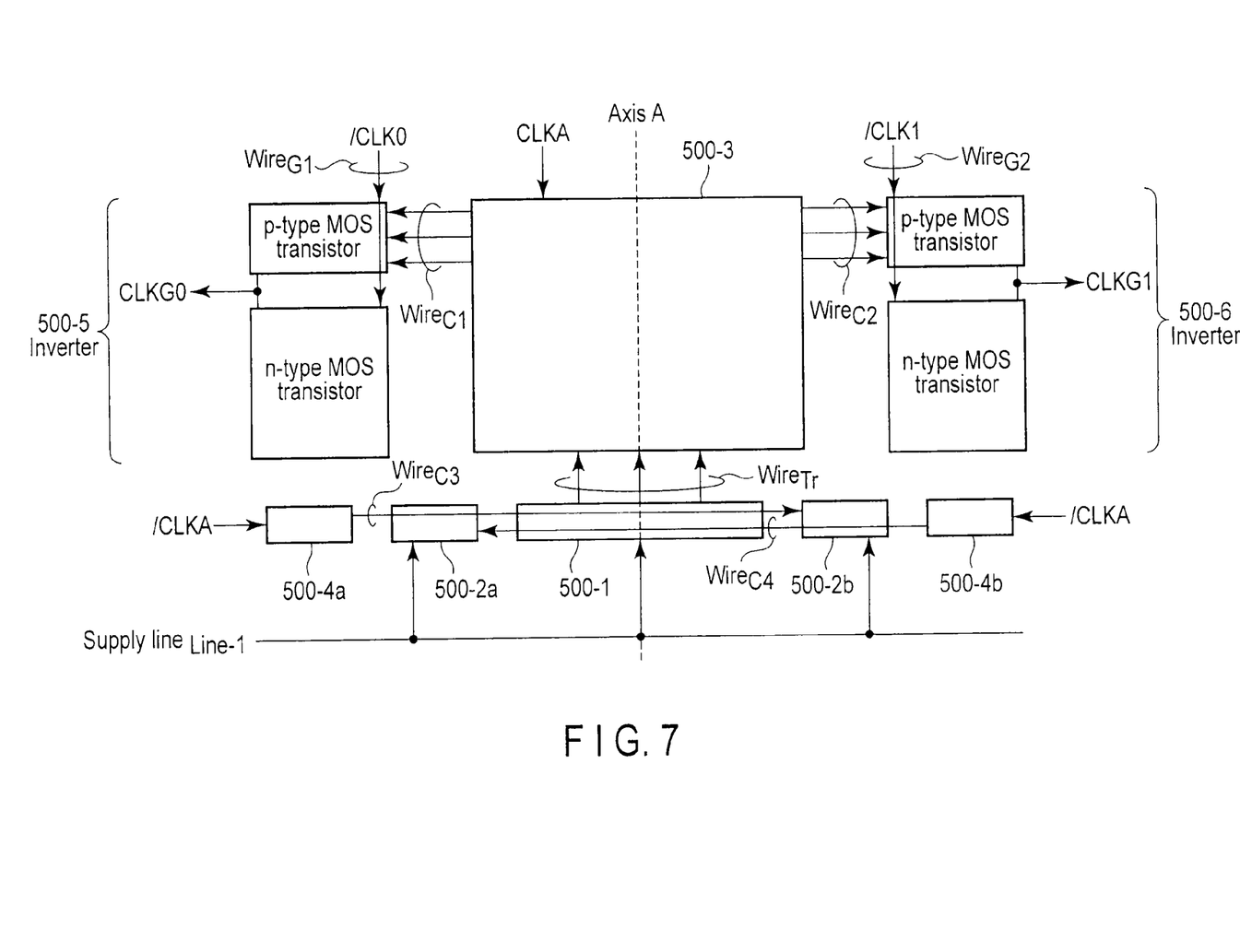
FIG. 7 is a schematic diagram illustrating a layout of the generation circuit according to the first embodiment.

Subsequently, a layout of the clock generation circuit 50 explained in FIG. 5 will be explained with reference to FIG. 7. As shown in FIG. 7, the capacitor element 500-3 occupying a large area is arranged in the center. The inverters 500-5 and 500-6 are arranged at either side of the capacitor element 500-3 so that the inverters 500-5 and 500-6 are arranged along an electrode surface of the capacitor element 500-3 so as to be axisymmetrical with respect to an axis A passing through the center of the electrode. The voltage VSUP×2 of the capacitor element 500-3 is transferred to the inverters 500-5 and 500-6 via a wire C1 and a wire C2. At this occasion, one of electrodes of the capacitor element 500-3 and source ends of the P-channel MOS transistors are respectively connected via wires C1, C2. A wire G1 is connected to the gates of the P-channel MOS transistor and the N-channel MOS transistor in the inverter 500-5, and the clock /CLK0 is supplied thereto via the wire G1. Likewise, a wire G2 is connected to the gates of the P-channel MOS transistor and the N-channel MOS transistor in the inverter 500-6, and the clock /CLK1 is supplied thereto via the wire G2.

Further, the MOS transistor 500-1 is arranged adjacent to the capacitor element 500-3 along the axis A. The source end of the MOS transistor 500-1 and one of electrodes of the capacitor element 500-3 are connected via a wire Tr.

As described above, the voltage VSUP is supplied to the MOS transistor 500-1 from the voltage source. A supply line Line-1 supplying the voltage VSUP is arranged in a direction perpendicular to the axis A and at the side opposite to the capacitor element 500-3 with the MOS transistor 500-1 interposed therebetween.

A capacitor element 500-4a is arranged between the supply line Line-1 and the inverter 500-5, and is connected with a MOS transistor 500-2b, explained later, via a wire C3.

A capacitor element 500-4b is arranged between the supply line Line-1 and the inverter 500-6, and is connected with a MOS transistor 500-2a, explained later, via a wire C4. These capacitor elements 500-4a and 500-4b have half the capacity of the capacitor element 500-4.

An MOS transistor 500-2a is arranged between the capacitor element 500-3 and the supply line Line-1 and between the MOS transistor 500-1 and the capacitor element 500-4a. Likewise, a MOS transistor 500-2b is arranged between the capacitor element 500-3 and the supply line Line-1 and between the MOS transistor 500-2 and the capacitor element 500-4b. These MOS transistors 500-2a and 500-2b have half the electric current supply rate as that of the capacitor element 500-2.

Each of the MOS transistor 500-2 and the capacitor element 500-4 are divided into two parts, so that a layout axisymmetrical with respect to the axis A is formed as shown in FIG. 7.

In the semiconductor device according to the present embodiment, the size of the area of the clock generation circuit 50 may be reduced. In other words, in the clock generation circuit 50 according to the present embodiment, the potential of the node N3 is increased to the voltage VSUP×2 using the capacitor element 500-3, and the node N3 is shared by the inverters 500-5 and 500-6. Since it is necessary to increase the potential of the node N3 to the voltage VSUP×2, it is necessary to increase the capacity of the capacitor element 500-1. The size of the area occupied by the capacitor element increases in proportion to the needed capacity.

If the inverters 500-5 and 500-6 do not share the node N3, and a capacitor element supplying the voltage VSUP×2 to the inverter 500-6 is additionally provided, the size of the area of the clock generation circuit 50 is increased due to the size of the area of the additionally provided capacitor element.

Since the clock generation circuit 50 may alternately output the clock /CLKG0 and the clock /CLKG1, the clock CLKA may be in synchronization with the clock /CLKG0 and the clock /CLKG1. More specifically, the potential of the node N3 may be changed to the voltage VSUP×2 in response to the clock CLKA when the clock /CLKG0 or the clock /CLKG1 is input to the inverter 500-5 or 500-6, respectively. Therefore, when the node N3 is commonly connected to the inverters 500-5 and 500-6, one of the capacitor elements may be omitted, which reduces the size of the area.

The capacitor element 500-4 is configured to drive the MOS transistor 500-1 so that the MOS transistor 500-1 may transfer the voltage VUSP to the node N3, and accordingly, the capacity of the capacitor element 500-4 is sufficiently smaller than the capacity of the capacitor element 500-3. Therefore, as compared with a capacitor element having a large capacity to drive the inverter 500-6, the clock generation circuit 50 according to the present embodiment may work with the capacitor element 500-3 and the capacitor element 500-4 having a sufficiently small capacity, and therefore, the size of the area may be reduced.

Further, the semiconductor device according to the present embodiment may stabilize the voltage VSUPn output by the charge pump 40-$n$. The reason for this will be explained below.

As explained above, the layout of the clock generation circuit 50 is arranged to be axisymmetrical with respect to the axis A. Therefore, the signal lines connected to members constituting the clock generation circuit 50 and transferring the clock signals have the same length. This may suppress variation of wire capacities and wire resistances of the signal wires, and eliminate variation in the waveforms of the voltages (clock signals) transmitted in the respective signal lines arranges symmetrically. This reduces variation of the clocks CLKG0, clock CLKG output from the inverters 500-5 and 500-6. That is, as shown in FIG. 2, the voltage VSUPn output from the charge pump 40-$n$ is a voltage having a stable waveform.

Second Embodiment

Figure 8:
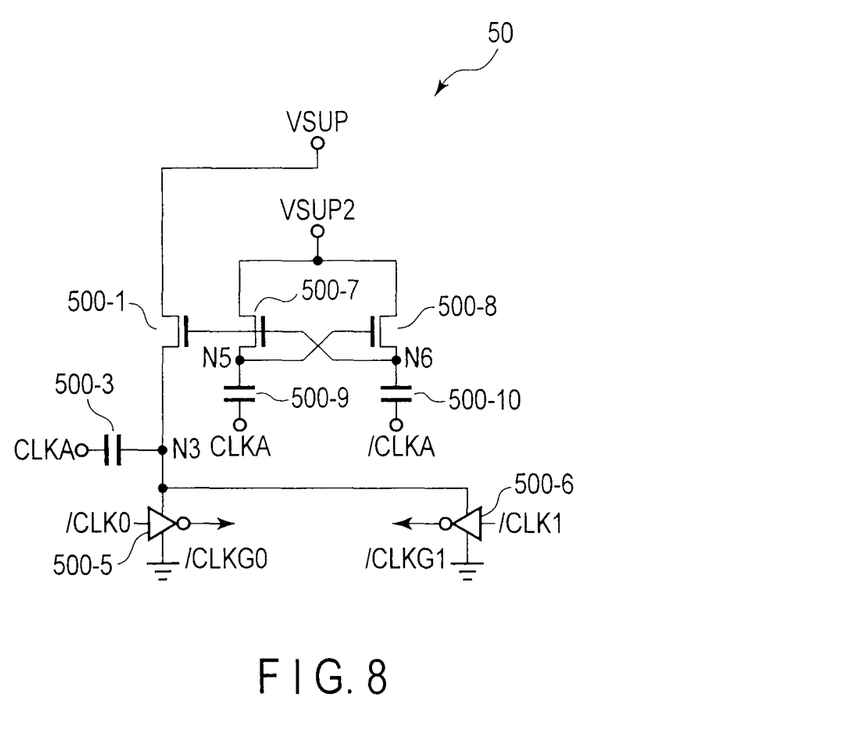
FIG. 8 is a schematic diagram illustrating a generation circuit according to the second embodiment.

Subsequently, a semiconductor device according to the second embodiment will be explained with reference to FIG. 8. FIG. 8 illustrates an example of a configuration of a clock generation circuit according to the present embodiment.
<1. Example of Configuration>

As shown in FIG. 8, the clock generation circuit 50 according to the present embodiment does not have the MOS transistor 500-2 and the capacitor element 500-4 of the clock generation circuit 50 according to the first embodiment explained above. Instead, the clock generation circuit 50 according to the present embodiment has N-channel MOS transistors 500-7 and 500-8, and capacitor elements 500-9 and 500-10. In the explanation below, the same elements as those of the clock generation circuit 50 according to the first embodiment will not be explained.

As shown in the figure, a voltage source VSUP2 (for example, a voltage equal to or more than a threshold voltage Vth1 of an MOS transistor 500-1 but less than a voltage VSUP) is supplied to one end of a current pathway of the MOS transistor 500-7, and the other end thereof is connected to a node N5. The gate of the MOS transistor 500-7 is connected to a node N6 and the gate of the MOS transistor 500-1. In other words, when the potential of the node N6 attains a threshold voltage of the MOS transistor 500-7 or more, the MOS transistor 500-7 is in the ON state, and a voltage VSUP2 is transferred to the node N5.

The voltage source VSUP2 is supplied to one end of the current pathway of the MOS transistor 500-8, and the other end thereof is connected to the node N6. The gate of the MOS transistor 500-8 is commonly connected at the node N5 with the other end of the current pathway of the MOS transistor 500-7. That is, when the potential of the node N5 increases to be a voltage more than the threshold voltage of the MOS transistor 500-8, the MOS transistor 500-8 transfers the voltage VSUP2 to the node N6.

Further, the node N5 is connected to one of electrodes of the capacitor element 500-9, and a clock CLKA is supplied to the other of the electrodes thereof. The node N6 is connected to one of electrodes of the capacitor element 500-10, and the clock CLKA is supplied to the other of the electrodes thereof.

Further, a clock /CLK0 is supplied to the gates of the P-channel MOS transistor and the N-channel MOS transistor constituting the inverter 500-5.

A clock /CLK1 is supplied to the gates of P-channel MOS transistor and the N-channel MOS transistor constituting the inverter 500-6.
<2. Operation of Clock Generation Circuit 50>

Figure 9:
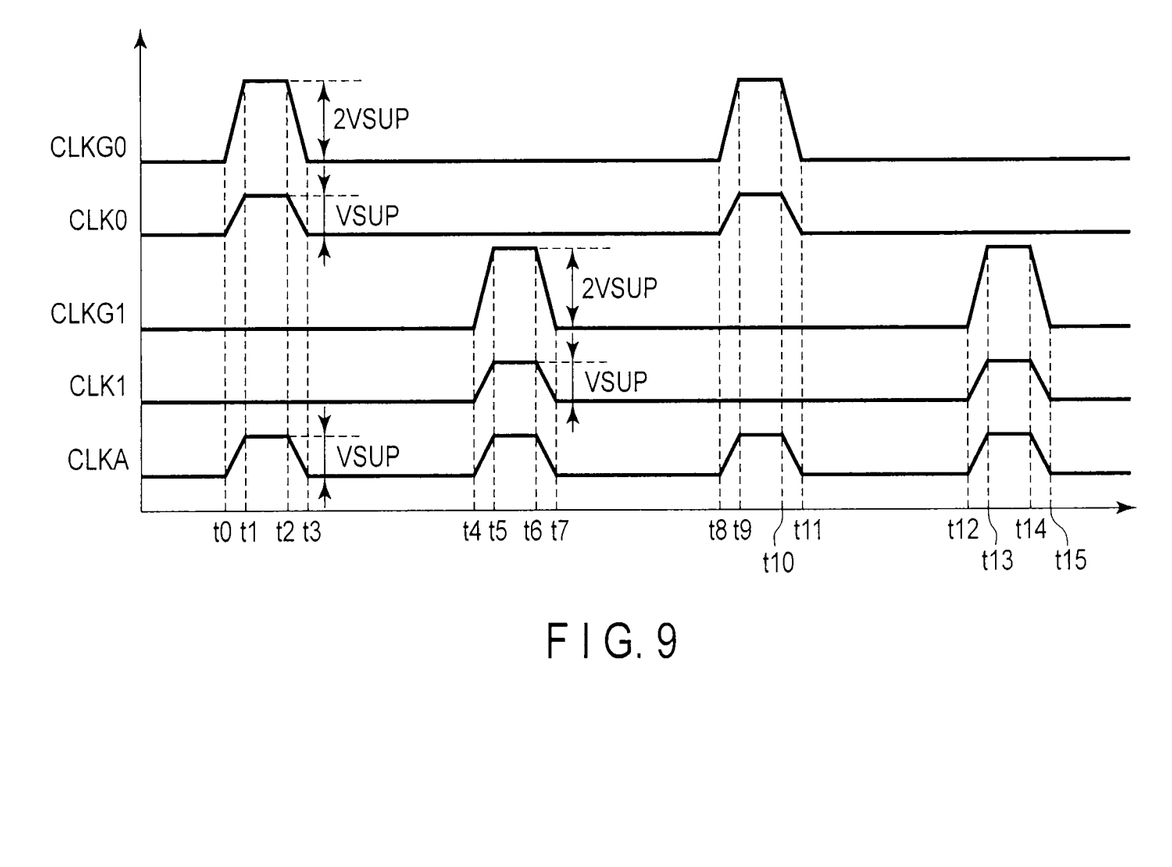
FIG. 9 is a time chart illustrating a clock provided to a generation circuit according to the second embodiment.

Subsequently, operation of a clock generation circuit 50 will be explained with reference to FIG. 9. FIG. 9 is a time chart illustrating operation of the clock generation circuit 50 according to the present embodiment. As shown in the figure, the horizontal axis represents a time, and the vertical axis represents the clock CLKG0, the clock CLK0, the clock CLKG1, the clock CLK1, and the clock CLKA.

First, the potential of the node N6 is assumed to be the voltage VSUP2 before time t0. In other words, it is assumed that the MOS transistor 500-8 transfers the VSUP2 to the node N6.

Since the clock CLKA is at the "L" level (clock /CLKA="H") before time t0, for example, the voltage VSUP is supplied to the capacitor element 500-10. As a result, the node N6 increases from the voltage VSUP2 to a voltage (VSUP2+VSUP). The voltage is applied to each of the gates of the MOS transistors 500-1, 500-7, and the potential of the node N3 is charged to the voltage VSUP by the MOS transistor 500-1. At this occasion, the reason why not only the voltage VSUP but also the voltage VSUP2 are applied to the gate of the MOS transistor 500-1 is to reliably increase the potential of the node N3 to the voltage VSUP using the MOS transistor 500-1. Since the MOS transistor 500-7 is in the ON state, the potential of the node N5 is charged to the voltage VSUP2. The potential of the node N6 is discharged from the voltage (VSUP+VSUP2), and thereafter, the potential changes to zero potential.

Subsequently, at time t1, the clock CLKA attains the "H" level. The voltage supplied by the clock CLKA is, for example, the voltage VSUP. Accordingly, the potential of the node N3 is charged to the voltage VSUP×2 by the capacitor element 500-3, and the potential of the node N5 is charged to the voltage (VSUP+VSUP2) by the capacitor element 500-9.

At the same time, i.e., time t1, the clock CLK0 is at the "H" level (clock /CLK0="L"). Therefore, a P-channel MOS transistor constituting the inverter 500-5 is in the ON state. As a result, at the same time, i.e., time t1, the clock CLKG0 having the voltage VSUP×2 is output from the output end of the P-channel MOS transistor.

Thereafter, at time t3, each of the clock CLK0 and the CLKG0 is at the "L" level.

Subsequently, at times t3 to t4, the clock CLKA attains the "L" level (clock /CLKA="H" level). Accordingly, the potential of the node N6 attains the voltage (VSUP2+VSUP). Therefore, each of the MOS transistors 500-1, 500-7 is in the ON state. The potential of the node N3 attains the voltage VSUP, and the potential of the node N5 attains the voltage (VSUP2+VSUP). Thereafter, at time t5, each of the clock CLKA and clock CLK1 attains the "H" level.

As a result, at the same time, i.e., time t5, the voltage of the node N3 having attaining the voltage (VSUP×2) is output from the inverter 500-6 as the clock CLKG1 of the voltage VSUP×2. Thereafter, at time t7, each the clock CLK1 and the clock CLKA attains the "L" level, and the clock CLKG1 also attains the "L" level.

The same applies after time t7, and description thereof is omitted.

<3. Layout of Clock Generation Circuit 50>

Figure 10:
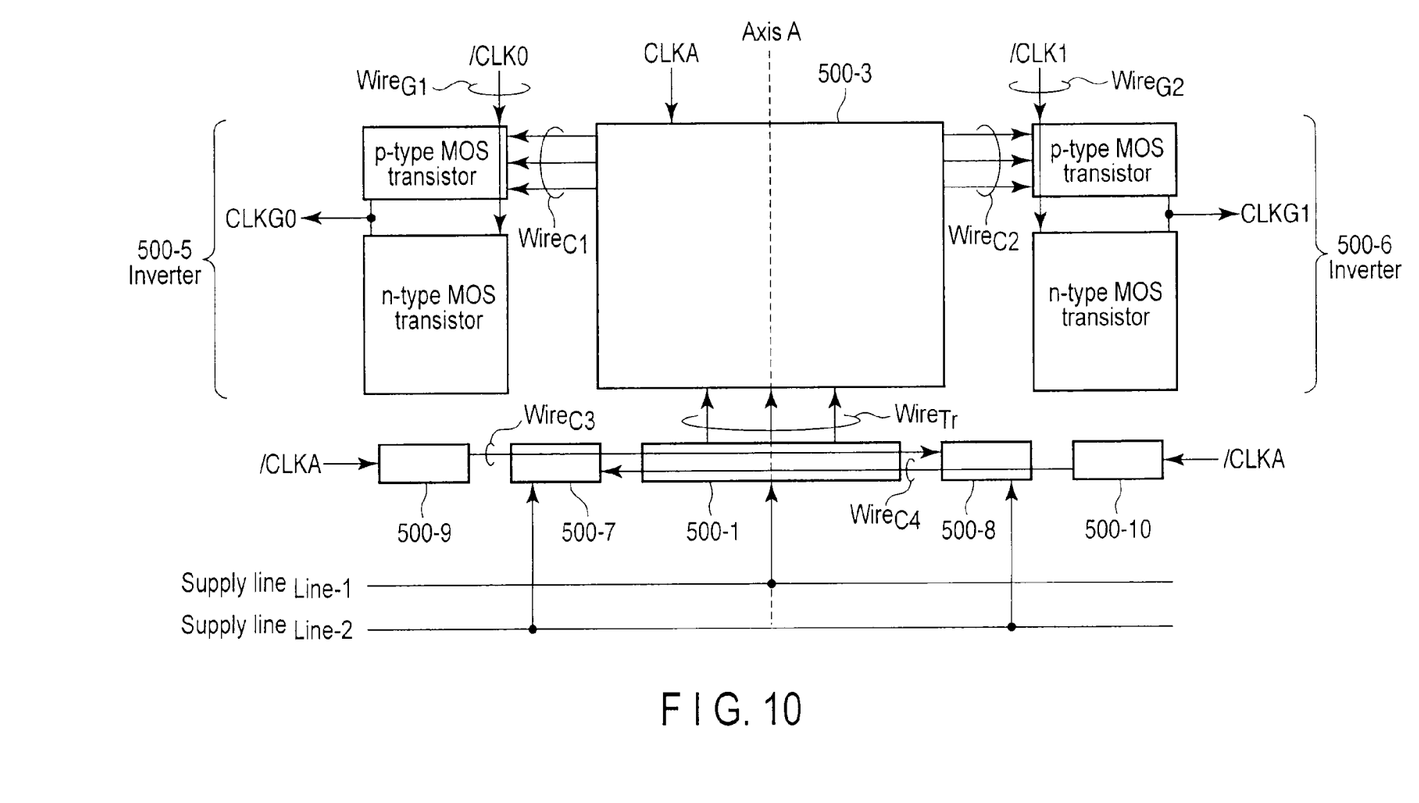
FIG. 10 is a schematic diagram illustrating a layout of the generation circuit according to the second embodiment.

Subsequently, a layout of the clock generation circuit 50 will be explained with reference to FIG. 10. It should be noted that only the difference from the layout of the first embodiment explained above will be explained.

As shown in the figure, the capacitor element 500-9 is arranged between the inverter 500-5 and a supply line Line-1 supplying the voltage VSUP. A capacitor element 500-10 is arranged between the supply line Line-1 and the inverter 500-6. A supply line Line-2 supplying the voltage VSUP2 is arranged adjacent to the supply line Line-1 in a direction perpendicular to an axis A.

The MOS transistor 500-7 is arranged between the capacitor element 500-3 and the supply line Line-1 and between the MOS transistor 500-1 and the capacitor element 500-9. Likewise, the MOS transistor 500-8 is arranged between the capacitor element 500-3 and the supply line Line-1 and between the MOS transistor 500-1 and the capacitor element 500-10.

In this case, the capacitor element 500-4 and the capacitor elements 500-9 and 500-10 have the same capacity. Therefore, a summation of the sizes of areas of the capacitor elements 4a, 4b respectively has the same sizes as the capacitor elements 9 and 10. In other words, as compared with FIG. 7, the arranged elements 500-9 and 500-10 occupy twice the size of area of each of the capacitor elements 4a and 4b. The MOS transistor 500-2 and the MOS transistors 500-7 and 500-8 have the same size of area. Therefore, as compared with FIG. 7, each of the arranged MOS transistors 500-7 and 500-8 has twice the size of areas of each of the MOS transistors 500-2a and 2b.

Even in the configuration of the semiconductor device according to the present embodiment, the size of area of the clock generation circuit 50 may be reduced below that of the conventional example. For example, the following case will be considered: ends of the current pathways of the P-channel MOS transistor constituting the inverters 500-5 and 500-6 are not commonly connected to the node N3. In this case, for example, it is necessary for the inverter 500-6 to have a configuration for outputting the voltage VSUP×2 as the clock CLKG1. More specifically, in this case, a MOS transistor and a capacitor element are connected. The MOS transistor transfers the voltage VSUP to one end of the current pathway of the P-channel MOS transistor constituting the inverter 500-6. One of electrodes of the capacitor element is connected to the one end of the current pathway of the P-channel MOS transistor, and the voltage VSUP is supplied to the other of the electrodes thereof.

At this occasion, the MOS transistor may have a function for transferring the voltage VSUP. Therefore, the size of area of the MOS transistor is less than that of the MOS transistor 500-1. However, the size of area of the capacitor element is the same as that of the capacitor element 500-3. This is because the potential of one end of the current pathway of the P-channel MOS transistor constituting the inverter 500-6 needs to be the voltage VSUP×2.

In contrast, according to the clock generation circuit 50 of the present embodiment, the inverters 500-5 and 500-6 are commonly connected at the node N3 even in the clock generation circuit 50 according to the present embodiment, like the first embodiment explained above. Therefore, the potential of the node N3 may be the voltage VSUP×2 when each of the inverters 500-5 and 500-6 transfers the voltage VSUP×2. This means that it is not necessary to provide the capacitor element corresponding to each inverter, unlike the circuit assumed above. Therefore, the size of area may be reduced. One of the reasons for this is that the clocks CLKG0 and CLKG1 are output from the inverters 500-5 and 500-6 at different points in time. That is, when the inverters 500-5 and 500-6 output the clocks CLKG0 and CLKG1, the potential of the node N3 may be the voltage VSUP×2, and moreover, the clocks CLKG0 and CLKG1 are output at different points in time as described above. Therefore, the capacitor element 500-3 may perform the same function as that achieved by the circuit assumed above.

In the semiconductor device according to the present embodiment, the circuit may be easily designed, and the operation may be stabilized. That is, in the configuration of the clock generation circuit 50 according to the present embodiment, members electrically connected to the capacitor element 500-3 may be reduced. In other words, as shown in FIG. 5, in the first embodiment, one of electrodes of the capacitor element 500-3 is connected to the gate of the MOS transistor 500-2, and one end of the current pathway of the MOS transistor 500-2 is connected to the gate of the MOS transistor 500-1. That is, when the capacitor element 500-3 is designed, not only the voltage applied to the inverter 500-5 but also the voltage applied to the MOS transistor 500-2 should be taken into consideration. Parameters exerting influence on the capacitor element 500-3 include not only the inverters 500-5, 500-6 but also the MOS transistor 500-2. When the cell characteristic of the MOS transistor 500-2 changes, the current value flowing through the node N4 changes, and accordingly, the voltage value applied to the gate of the MOS transistor 500-1 changes. Therefore, various problems occur in that the voltage may not be sufficiently transferred to the node N3, and there occurs a time delay in attaining the voltage VSUP.

In contrast, according to the semiconductor device of the present embodiment, one of electrodes of the capacitor element 500-3 is connected to only the inverters 500-5 and 500-6 in the clock generation circuit 50. Therefore, the capacitor element 500-3 may be easily designed, and the capacitor element 500-3 is less likely to be affected by the changes of characteristics of the other members. Therefore, the operation of the clock generation circuit 50 is stabilized.

Further, like the first embodiment explained above, the layout of the clock generation circuit 50 is arranged to be axisymmetrical with respect to the axis A in the present embodiment. Therefore, the signal lines connected to members constituting the clock generation circuit 50 and transferring the clock signals have the same length. This may suppress variation of wire capacities and wire resistances of the signal wires, and eliminate variation in the waveforms of the voltages (clock signals) transmitted in the respective signal lines arranges symmetrically. This reduces variation of the clocks CLKG0, clock CLKG 1 output from the inverters 500-5 and 500-6. That is, as shown in FIG. 2, the voltage VSUPn output from the charge pump 40-n is a voltage having a stable waveform.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor storage device comprising:
a first transistor, one end of which is connected to a first voltage source supplying a first voltage;
a first node which is charged to the first voltage by the first transistor;
a first capacitor, one of electrodes of which is connected to the first node, and the other of the electrodes of which is supplied with a first clock signal having a second voltage;
a first switch element, one end of which is connected to the first node, the first switch element outputting a potential of the first node at a first time at which the first switch element is turned on; and
a second switch element, one end of which is connected to the first node, the second switch element outputting the potential of the first node at a second time, which is different from the first time, at which the second switch element is turned on.

2. The device according to claim 1, wherein
the first switch element and the second switch element are arranged at axisymmetrical positions with respect to an axis parallel to an electrode surface of the first capacitor and passing through a center of the electrode,
the first transistor is arranged adjacent to the first capacitor along the axial direction, and
a first supply line of the voltage source is arranged along a direction perpendicular to the axis at a side opposite to the first capacitor with the first transistor interposed therebetween.

3. The device according to claim 2, further comprising:
a second capacitor having a capacity less than a capacity of the first capacitor; and
a second transistor having a lower electric supply performance than the first transistor,
wherein the second capacitor is divided into a third capacitor and a fourth capacitor each of which has half of the capacity, and the third capacitor is arranged along the axis between the first switch element and the supply line,
the fourth capacitor is arranged along the axis between the second switch element and the supply line,
the second transistor is divided into a third transistor and a fourth transistor each of which has half the electric supply performance of the second transistor, and the third transistor is arranged along the axis between the first capacitor and the supply line and between the third capacitor and the first transistor, and
the fourth transistor is arranged along the axis between the first capacitor and the supply line and between the fourth capacitor and the first transistor.

4. The device according to claim 1, further comprising:
a third transistor, one end of which is supplied with a second voltage source outputting a second voltage less than the first voltage, the third transistor transferring the second voltage less than the first voltage to a third node in accordance with a potential of a second node connected to the gate of the first transistor;
a fourth transistor which transfers the second voltage supplied from the second voltage source to the second node in accordance with the second voltage which the third transistor transfers to the third node;
a sixth capacitor, one of electrodes of which is connected to the other end of the third transistor and the other of the electrodes of which receives the first clock signal, the sixth capacitor having a capacity less than the capacity of the first capacitor; and
a seventh capacitor, one of electrodes of which is connected to the other end of the fourth transistor and the other of the electrodes of which receives a reverse signal of the first clock signal, the seventh capacitor having the same capacity as the sixth capacitor.

5. The device according to claim 4, wherein
the first switch element and the second switch element are arranged at axisymmetrical positions with respect to an axis parallel to an electrode surface of the first capacitor and passing through a center of the electrode,
the first transistor is arranged adjacent to the first capacitor along the axial direction,
a first supply line for transferring the first voltage is arranged along a direction perpendicular to the axis at a side opposite to the first capacitor with the first transistor interposed therebetween,
a second supply line for transferring the second voltage is arranged, adjacent to the first line, at a side opposite to the first transistor,
the sixth capacitor is arranged along the axis between the first switch element and the first supply line,
the seventh capacitor is arranged along the axis between the second switch element and the first supply line,
the third transistor is arranged along the axis between the first capacitor and the first supply line and between the sixth capacitor and the first transistor, and
the fourth transistor is arranged along the axis between the first capacitor and the first supply line and between the seventh capacitor and the first transistor.

6. The device according to claim 1, wherein
The switch element is an inverter circuit, one end of which is connected to the first node, and the switch element outputs the potential of the first node.

7. The device according to claim 6, wherein
a first signal for turning on/off the switch element is supplied to the switch element, and
the first signal is supplied to the switch element so that the switch element is turned on when the second voltage is supplied to the other of the electrodes of the first capacitor.

8. The device according to claim 1, further comprising:
a second capacitor one of electrodes of which is connected to the gate of the first MOS transistor, and the other of the electrodes of which is supplied with a second clock signal having the second voltage and being different from the first clock signal, and
when the first clock signal is at the first level, the second clock signal attains a second level different from the first level so that the first MOS transistor is turned on and the first node attains the first voltage.

9. The device according to claim 8, wherein
The second clock signal is a reverse signal of the first clock signal.

10. A method of controlling a semiconductor storage device comprising:
turning on a first MOS transistor, one end of which is connected to a first node, by supplying a first clock signal to one of electrodes of a first capacitor element so that the first MOS transistor transfers a first voltage to the first node;
charging the first node to a second voltage by supplying a second clock signal having the first voltage to the other of electrodes of a second capacitor element, one of electrodes of which is connected to the first node, after the first node attains the first voltage, and
outputting a potential of the first node at a first time when the first node is charged.

11. The method according to claim 10, further comprising:
at the first time, turning on the first switch element connected to the first node in order to output the second voltage of the first node.

12. The method according to claim 11, wherein
at the first time, a first switching signal is input to the first switch element in order to turn on the first switch element.

13. The method according to claim 11, further comprising:
turning on a second MOS transistor, one end of a current pathway of which is connected to a second node, by charging the second voltage and
attaining the second node to the first voltage, the second node is connected to the other of the electrodes of the first capacitor and the gate of the first MOS transistor.

14. The method according to claim 11, further comprising:
outputting the potential of the first node at a second time, the second time being different from the first time,
wherein the second time is a time when the first node is charged to the second voltage.

15. The method according to claim 14, further comprising:
at the second time, turning on the second switch element connected to the first node in order to output the second voltage of the first node.

16. The method according to claim 15, wherein
at the second time, a second switching signal is input to the second switch element in order to turn on the second switch element.

17. The method according to claim 16, wherein
the second signal is a signal obtained as a result of NAND operation of the first switching signal and the second switching signal.

* * * * *